(12) United States Patent
Chen

(10) Patent No.: US 6,665,188 B1
(45) Date of Patent: Dec. 16, 2003

(54) SNAPPING DEVICE FOR CPU COOLER

(75) Inventor: Tsan-Jung Chen, Sanchung (TW)

(73) Assignee: Kocam International Co., Ltd., Taipei Hsien (TW)

(*) Notice: Subject to any disclaimer, the term of this patent is extended or adjusted under 35 U.S.C. 154(b) by 0 days.

(21) Appl. No.: 10/298,594

(22) Filed: Nov. 19, 2002

(51) Int. Cl.[7] .................................................. H05K 7/20
(52) U.S. Cl. ...................... 361/719; 24/258; 248/510; 257/719
(58) Field of Search .......................... 439/485; 248/505, 248/510; 24/453, 457, 458, 625; 165/80.3, 185; 174/16.3; 257/718, 719, 726, 727; 361/703–705, 709–712, 717–719, 720

(56) References Cited

U.S. PATENT DOCUMENTS 5,220,485 A * 6/1993 Chakrabarti ................ 361/720
5,546,275 A * 8/1996 Moutrie et al.
6,480,386 B1 * 11/2002 Yu ............................. 361/704

* cited by examiner

Primary Examiner—Gerald Tolin
(74) Attorney, Agent, or Firm—Bacon & Thomas, PLLC

(57) ABSTRACT

The present invention is to provide a snapping device comprising a fastening resilient strip including a main body; at least one bolt parallel to the fastening resilient strip; a contact section moveable along the shank of the bolt; and a hollow support secured to a circuit board having a central hole for receiving an element (such as a CPU) mounted thereon and enabling top of the element to be in contact with a cooler mounted in the support, wherein the fastening resilient strip is secured to the support. Thus, while rotating the bolt, the contact section moves along the bolt toward the cooler due to a reaction of the main body and tightly press the cooler onto the element in an optimum contact condition.

10 Claims, 6 Drawing Sheets

SNAPPING DEVICE FOR CPU COOLER

FIELD OF THE INVENTION

The present invention relates to fastening of a cooler on CPU (central processing unit) and more particularly to an improved snapping device for reliably fastening the CPU cooler and increasing a heat dissipation capability of the CPU cooler.

BACKGROUND OF THE INVENTION

A conventional CPU cooling assembly is shown in FIG. 1A. As shown, it comprises a fastening resilient strip 9 including a main body 91, two arms 92 at both ends, and two openings 93 at both arms 92. A hollow four-sided support 82 is provided around a plurality of apertures 86 arranged as two enclosed squares on a circuit board 81. Two tabs 83 are formed on opposite sides of the support 82. Further, the tabs 83 are disposed corresponding to the openings 93. It is possible of inserting the tabs 83 into the openings 93 after a CPU 84 is secured on the apertures 86. Also, the main body 91 is pressed on a central channel 801 of a cooler 80. Hence, the cooler 80 is secured onto the CPU 84. As an end, heat generated by the running CPU 84 can be driven away via the cooler 80.

As stated above, the cooler 80 is secured onto the CPU 84 so as to absorb heat generated by the running CPU 84 prior to driving away heat via fins 802 of the cooler 80. As such, an optimum pressure should be exerted on the CPU 84 by the cooler 80. A poor heat conduction may be occurred between the cooler 80 and the CPU 84 if the pressure exerted on the cooler 80 by the main body 91 is not enough. This is true for the conventional CPU cooling assembly since the pressure exerted on the cooler 80 by the fastening resilient strip 9 is mainly caused by the fastening of the tabs 83 and the openings 93 at the arms 92. Further, apparently such pressure is not sufficient to appropriately press the cooler 80 on the CPU 84.

A solution to the above problem of insufficient pressure is illustrated in FIG. 1B. As shown, each arm 92 is bent to form a horizontal positioning member 94 with the opening 93 provided thereat. In assembly, a plurality of screws (two are shown) 95 are driven through the openings 93 to secure the fastening resilient strip 9 to the circuit board 81. It is advantageous since the fastening resilient strip 9 is able to exert a sufficient pressure on the cooler 80. However, for the purpose of exerting a uniform pressure on the cooler 80 a simple single driving of either screw 95 is not adopted. Instead, a stepwise technique of advancing one screw 95 a predetermined distance and then advancing the other screw 95 the same predetermined distance in alternate is implemented until the fastening resilient strip 9 is secured to the circuit board 81. Inevitably, it is a time-consuming process, resulting in a contradiction to mass production implemented in a long period of time. Thus, it is desirable to provide an improved snapping device in order to overcome the above drawbacks of the prior art.

SUMMARY OF THE INVENTION

A primary object of the present invention is to provide a snapping device for reliably fastening a cooler on a CPU and increasing a heat dissipation capability of the cooler. By utilizing this snapping device, it is possible of overcoming the drawback of the first prior art such as poor heat conduction between the cooler and the CPU since there is no sufficient pressure exerted on the cooler and the drawbacks of the second prior art such as a uniform pressure on the cooler being difficult which in turn causes a poor heat conduction between the cooler and the CPU, and a time-consuming assembly process.

To achieve the above and other objects, the present invention provides a snapping device comprising a fastening resilient strip including a main body; at least one bolt parallel to the fastening resilient strip; a contact section moveable along the shank of either bolt; and a hollow support secured to a circuit board having a central hole for receiving an element mounted on the circuit board, wherein a cooler is mounted in the support and is in contact with the top of the element for dissipating heat generated by the element so as to achieve the purpose of quickly securing the fastening resilient strip to the circuit board and securing the cooler to the element on the circuit board. At this position, the fastening resilient strip is secured to the support and the contact section is on the cooler. In response to a rotation of the at least one bolt, the contact section moves along the bolt. As such, the contact section moves toward the cooler because a reaction is occurred in the main body, the cooler is pressed on the element consequently. As an end, the cooler is in an optimum contact with the element.

The above and other objects, features and advantages of the present invention will become apparent from the following detailed description taken with the accompanying drawings.

DETAILED DESCRIPTION OF THE PREFERRED EMBODIMENTS

Figure 1A:
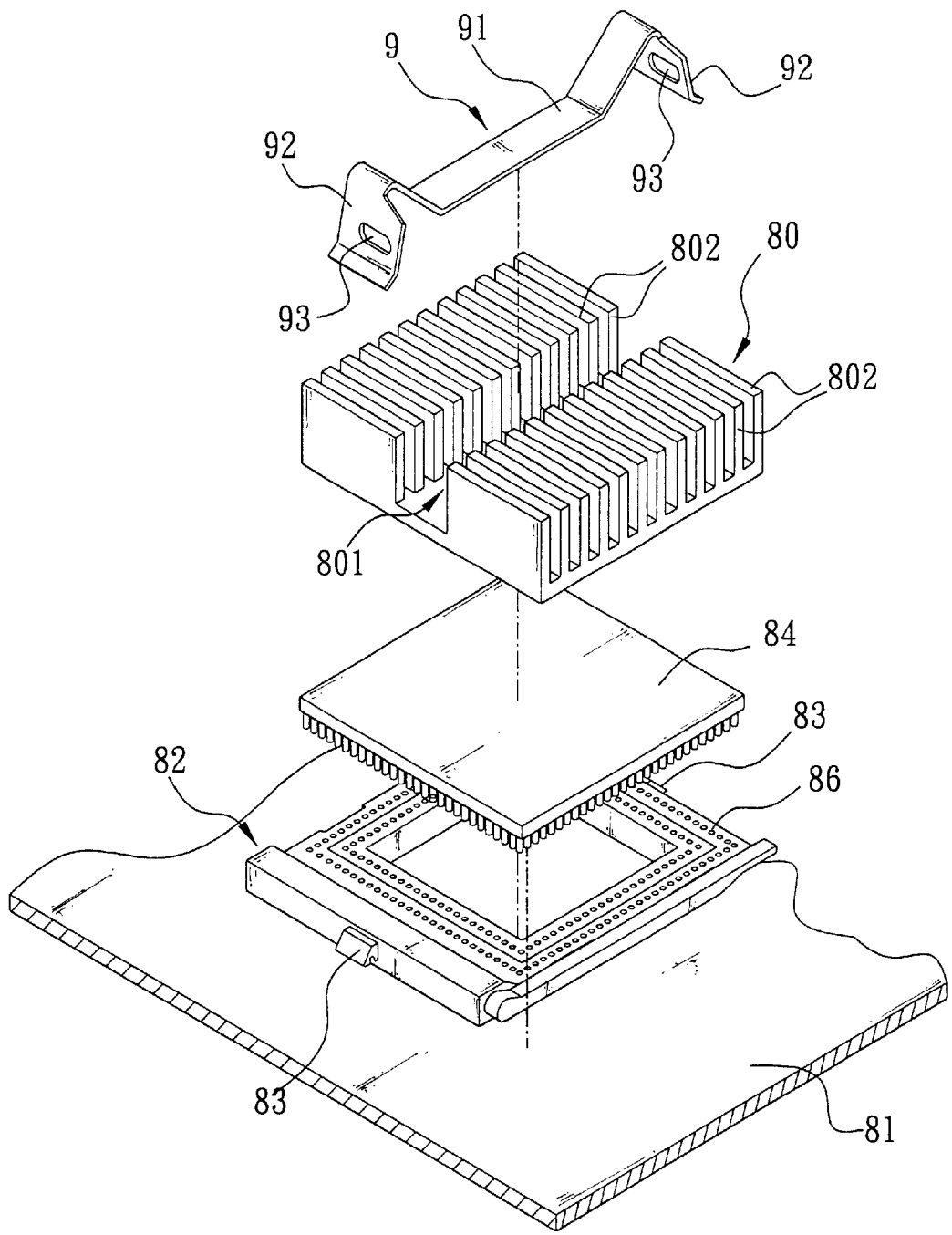
FIG. 1A is an exploded view of a conventional CPU cooling assembly.
Figure 1B:
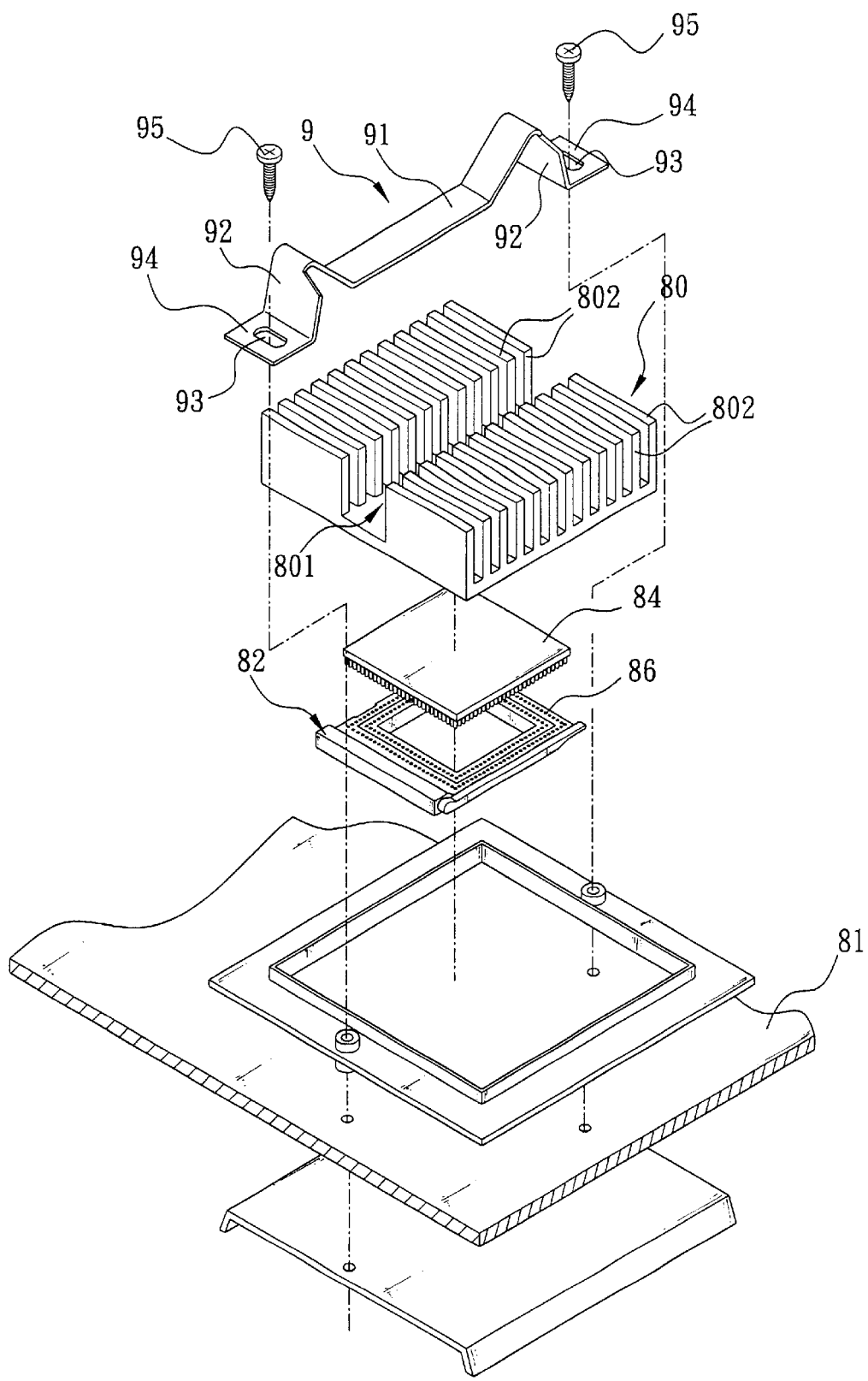
FIG. 1B is an exploded view of another conventional CPU cooling assembly.
Figure 2:
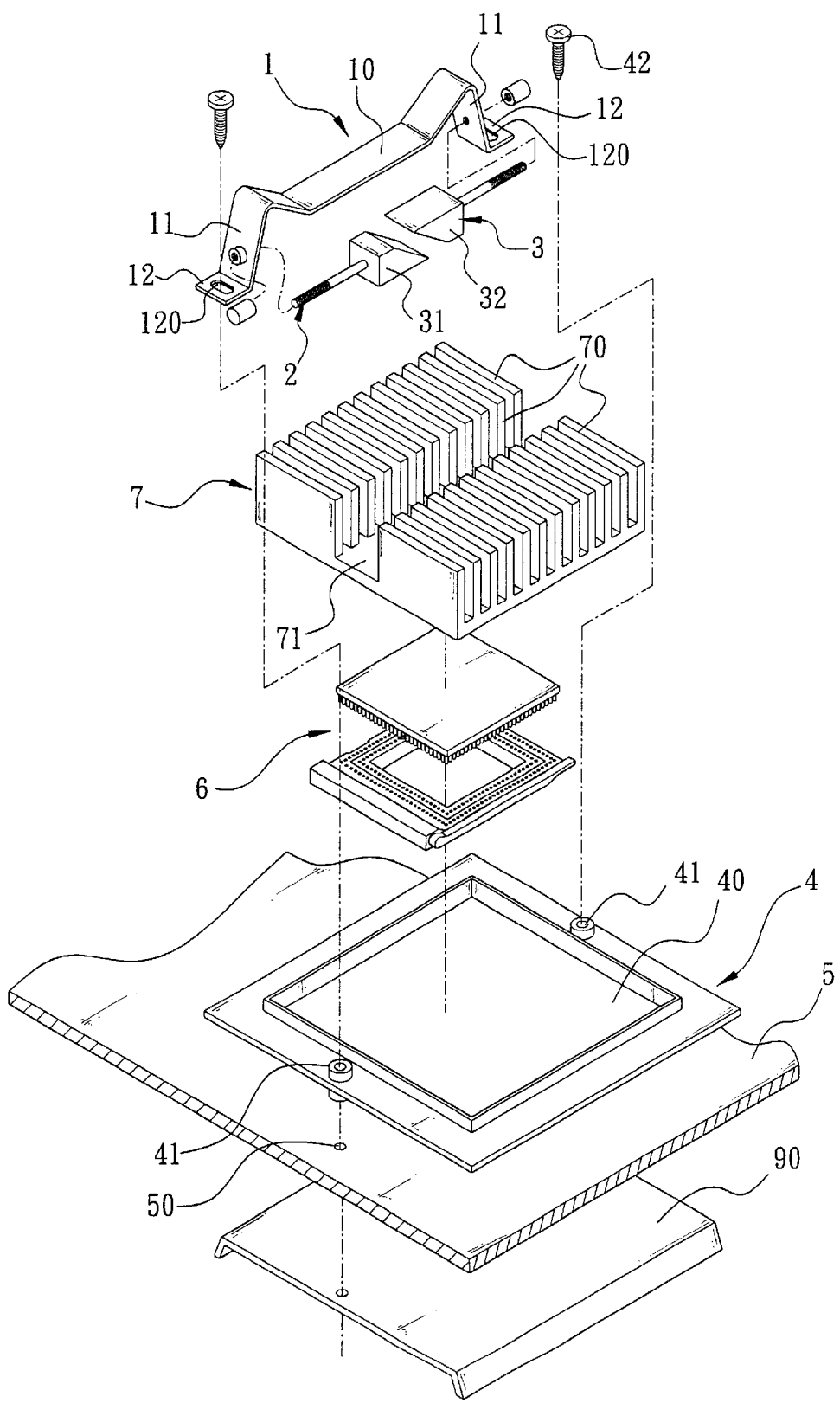
FIG. 2 is an exploded view of a first preferred embodiment of a snapping device for cooler to be mounted on a CPU according to the invention.

The invention is directed to a snapping device as shown in FIG. 2. It comprises a fastening resilient strip 1 including a main body 10, two arms 11 at both ends, and two horizontal positioning members 12 formed by bending the arms 11, two bolts 2 releasably driven through the arms 11, the bolts 2 being parallel to the main body 10; a contact section 3 moveable along a lengthwise direction of either bolt 2; and a hollow four-sided (square as shown) support 4 having a central hole 40, the support 4 being secured to a circuit board (e.g., motherboard) 5 so that an element (e.g., CPU) 6 mounted on the circuit board 5 can be located within the central hole 40 and the heat generated by the element 6 will be dissipated as detailed below. A cooler 7 is mounted in the support 4 and is in contact with the top of the element 6. Also, the positioning members 12 are secured to the support 4. Next, rotate the bolts 2 to move the contact section 3 about the main body 10. As such, the contact section 3 moves toward the cooler 7 because a reaction is occurred in the main body 10. As a result, the cooler 7 is pressed on the element 6, i.e., the cooler 7 is secured.

Referring to FIG. 2, a commercially available cooler 7 comprises a plurality of fins 70 projected upward. A straight channel 71 is formed on the center of the fins 70. The provision of the channel 71 is to facilitate the fastening of the cooler 7 and the circuit board 5 by securing the fastening resilient strip 1 thereto. For example, in the invention the main body 10 and the contact section 3 are installed in the channel 71 for fastening the cooler 7. Note that a plurality of variations of the main body 10, the contact section 3, and the bolts 2 are possible for securing the cooler 7 to the circuit board 5 as detailed below.

Figure 3A:
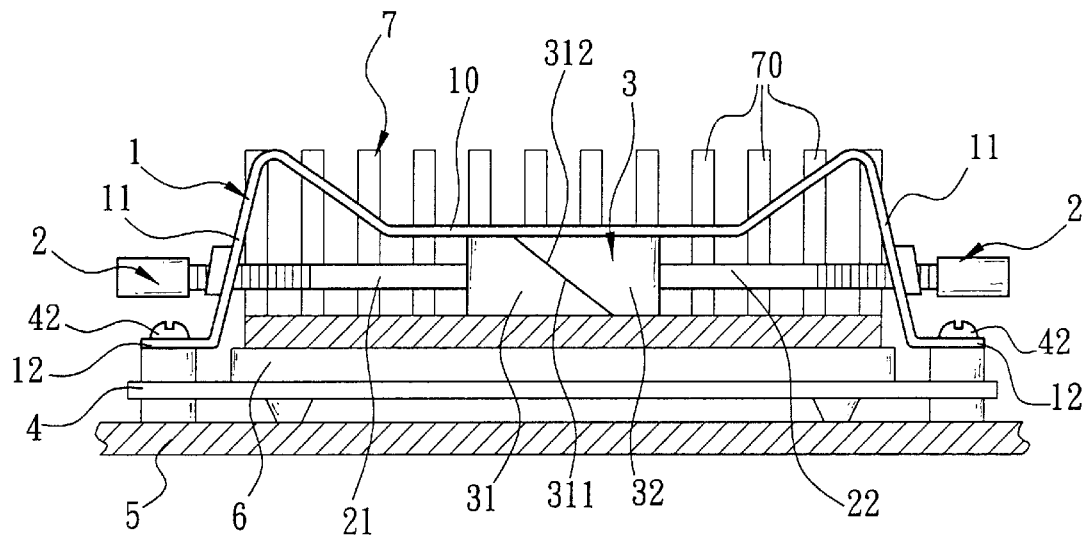
FIG. 3A is a cross-sectional view of the assembled snapping device, cooler, and CPU shown in FIG. 2 where the cooler has not been fastened by the snapping device.
Figure 3B:
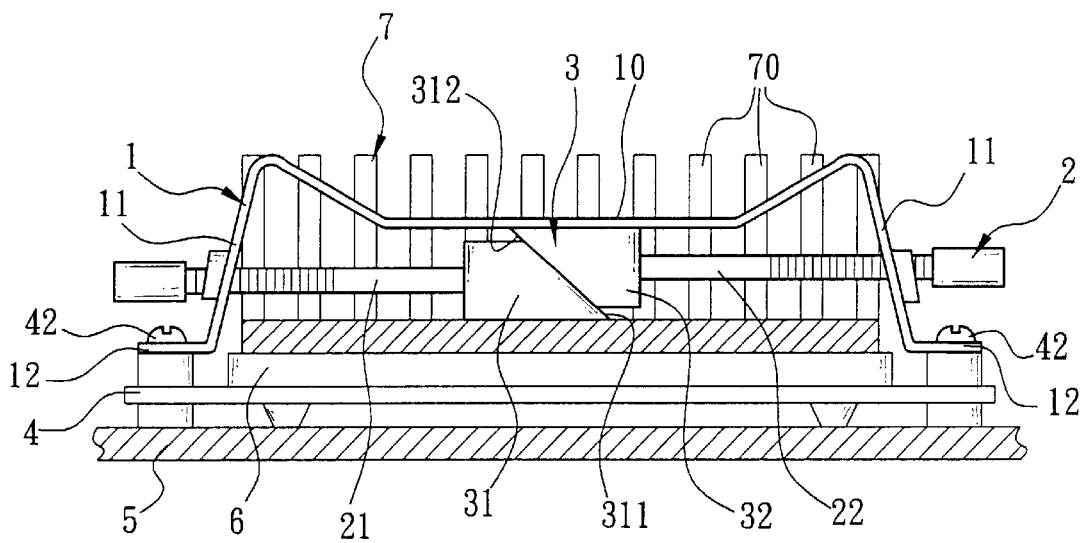
FIG. 3B is a view similar to FIG. 3A where the cooler has been fastened by the snapping device.

Referring to FIG. 3A, there is shown a first preferred embodiment of the invention in which the contact section 3 comprises a first contact member 31 and a separate second mating contact member 32 capable of engaging with the first contact member 31; one bolt 2 comprises a first shank 21; and the other bolt 2 comprises a second shank 22 with the contact section 3 sandwiched between the shanks 21 and 22. In other words, a tip of the first shank 21 is engaged with the first contact member 31 and a tip of the second shank 22 is engaged with the second mating contact member 32 respectively. A first slanted surface 311 is formed on the first contact member 31 and a parallel second slanted surface 312 is formed on the second mating contact member 32 respectively. The first and the second slanted surface 311 and 312 are urged against each other when the first and the second shanks 21 and 22 are rotated. As shown in FIG. 3B, the second mating contact member 32 slides upward to lift the main body 10 while the first contact member 31 slides down toward the cooler 7. As such, the cooler 7 is pressed on the element 6. As a result, the cooler 7 is fastened.

Figure 4A:
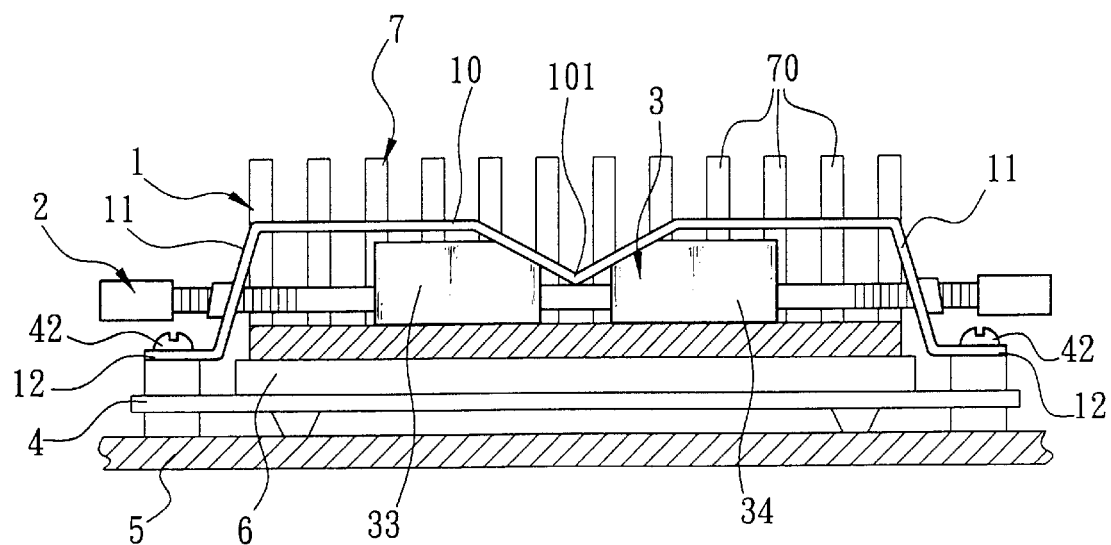
FIG. 4A is a cross-sectional view of a second preferred embodiment of a snapping device for CPU cooler where the cooler has not been fastened by the snapping device.
Figure 4B:
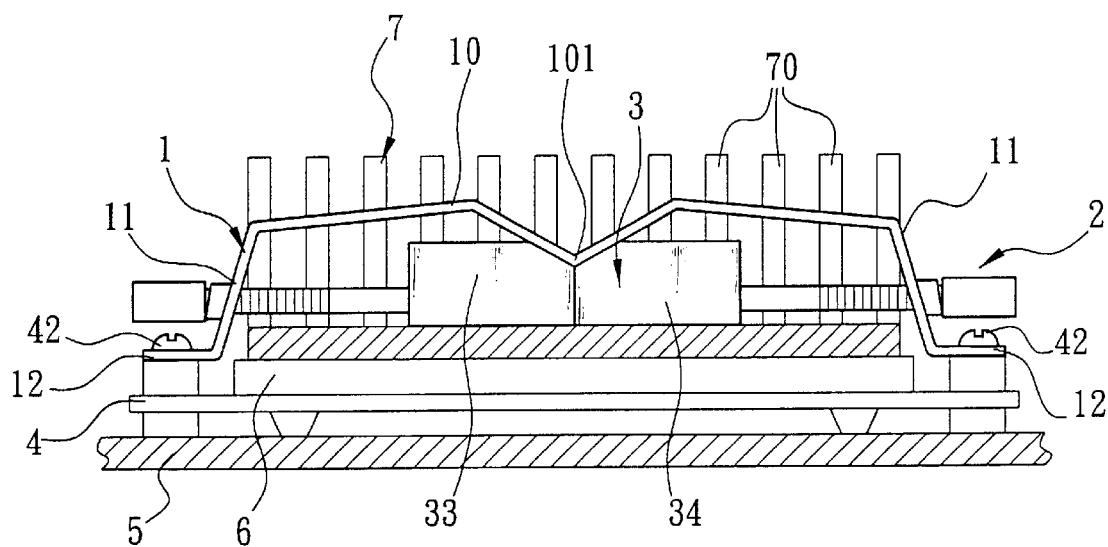
FIG. 4B is a view similar to FIG. 4A where the cooler has been fastened by the snapping device.

Referring to FIG. 4A, there is shown a second preferred embodiment of the invention in which an inverted gable member 101 is formed at the center of the main body 10 with the angle thereof faced the contact section 3. As such, the fastening resilient strip 1 is substantially shaped as an M. The bolt 2 has two thread portions advanced from both heads toward the inverted gable member 101 in which one thread portion has a spiral edge advanced opposite to that of the other thread portion. The contact section 3 comprises third and fourth contact members 33 and 34 both at the tips of the bolts 2. The third and the fourth contact members 33 and 34 are moved toward the inverted gable member 101 as the bolt 2 is rotated as shown in FIG. 4B. Next, the inverted gable member 101 is urged by the third and the fourth contact members 33 and 34 from opposite sides. A reaction is then occurred in the main body 10 due to the urging of the third and the fourth contact members 33 and 34. Hence, the cooler 7 is pressed down by the third and the fourth contact members 33 and 34. As a result, the cooler 7 is pressed on the element 6.

Figure 5A:
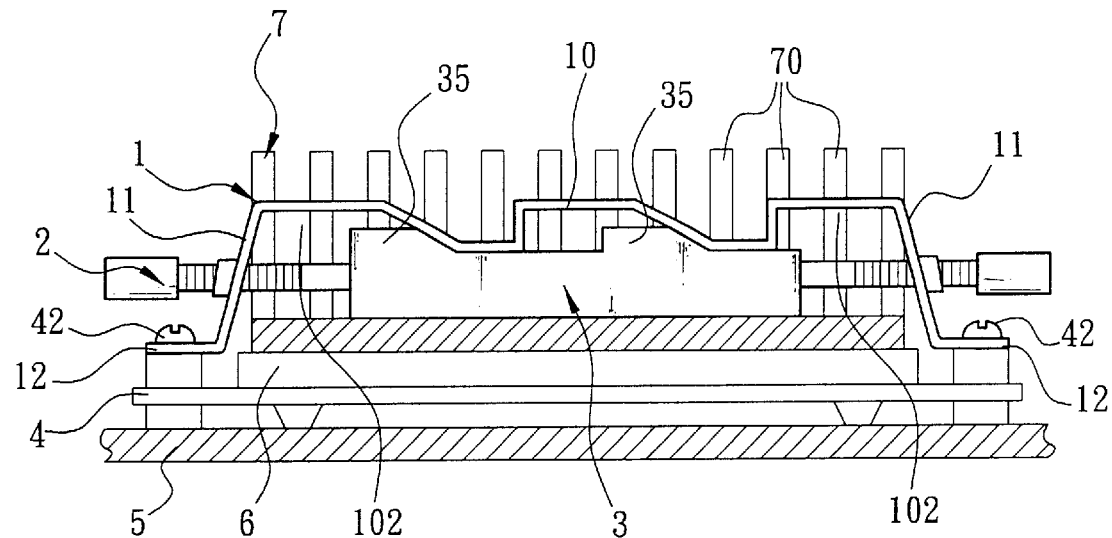
FIG. 5A is a cross-sectional view of a third preferred embodiment of a snapping device for CPU cooler where the cooler has not been fastened by the snapping device.
Figure 5B:
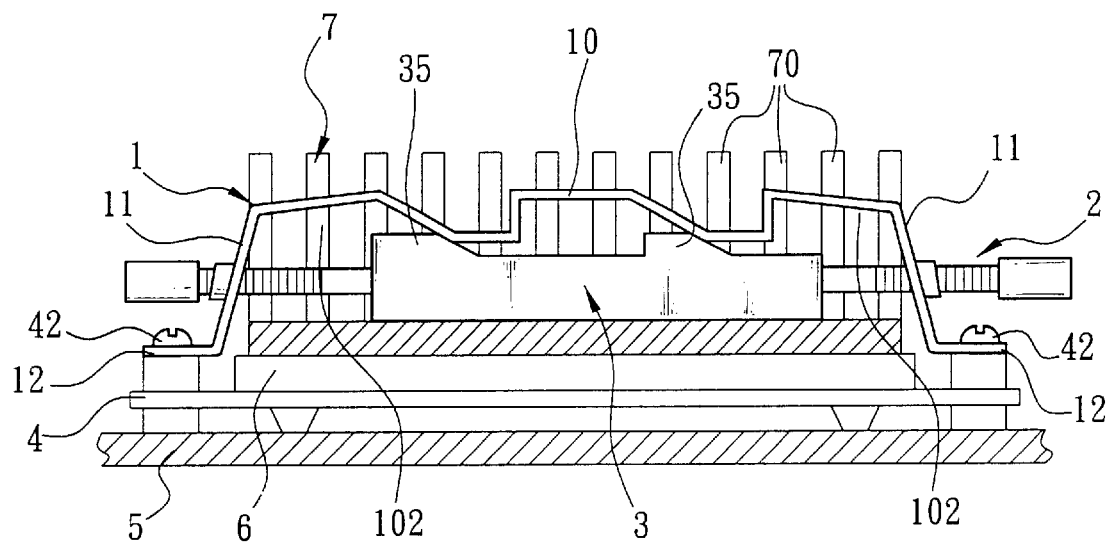
FIG. 5B is a view similar to FIG. 5A where the cooler has been fastened by the snapping device.

Referring to FIG. 5A, there is shown a third preferred embodiment of the invention in which there is a plurality of oblique recesses 102 (three are shown) are spaced apart at the main body 10 facing the contact section 3. Correspondingly, a plurality of oblique blocks 35 (two are shown) are spaced apart on the contact section 3 facing the main body 10 in which the oblique blocks 35 are disposed in the oblique recesses 102 in this state. The contact section 3 is moved along the bolt 2 as the bolt 2 is rotated as shown in FIG. 5B. Next, the oblique blocks 35 clear from the oblique recesses 102 to move to positions each between any two adjacent oblique recesses 102. A reaction is then occurred in the main body 10 due to the urging of the contact section 3 against the main body 10. Hence, the cooler 7 is pressed down by contact section 3. As a result, the cooler 7 is pressed on the element 6.

Referring to FIGS. 2, 3A, 3B, 4A, 4B, 5A, and 5B the cooler 7 is provided on the element 6 so that heat generated by the running element 6 can be driven away via the cooler 7. As such, an optimum pressure should be exerted on the element 6 by the cooler 7. Thus, a poor heat conduction may be occurred between the cooler 7 and the element 6 if the pressure exerted on the cooler 7 by the main body 10 is not enough. To the contrary, the element 6 may be damaged by the cooler 7 if the pressure exerted on the cooler 7 by the main body 10 is excessively large. Preferably, a mark or scale may be labeled on the bolt 2 and another mark or pointer may be labeled on the fastening resilient strip 1 based on experimental data or experience. In use, a user simply rotates the bolt 2 until the mark (or scale) thereof is aligned with the mark (or pointer) on the fastening resilient strip 1. At this position, the desired optimum pressure is exerted on the cooler 7 by the main body 10.

Referring to FIG. 2 again, in the embodiment two openings 120 are formed at both positioning members 12. Further, the support 4 has a plurality of threaded holes 41 (two are shown) disposed corresponding to the openings 120. Furthermore, the circuit board 5 has a plurality of apertures 50 (only one is shown) disposed corresponding to the threaded holes 41. Hence, a plurality of fasteners (e.g., screws (two are shown) or bolt and nut combinations) 42 may be driven through the support 4 and the circuit board 5 to secure the fastening resilient strip 1 to an abutment plate at the other side (i.e., underside) of the circuit board 5.

Referring to FIG. 2 again, in the embodiment a plurality of electronic components (not shown) are provided on the circuit board 5 adjacent the element 6. Hence, a rotation of the bolt 2 may be hindered. Preferably, a slot (e.g., hexagonal slot) is formed on the head of the bolt 2. As such, a tool (e.g., screwdriver having a hexagonal tip) may be used to rotate the bolt 2 by exerting force on the hexagonal slot. As a result, the contact section 3 is moved along the bolt 2. Alternatively, a polygonal (e.g., hexagonal) projection is formed on the head of the bolt 2. As such, a tool (e.g., screwdriver having a hexagonal recessed tip or a wrench) may be used to rotate the bolt 2 by exerting force on the polygonal projection. As a result, the contact section 3 is moved along the bolt 2.

While the invention has been described by means of specific embodiments, numerous modifications and variations could be made thereto by those skilled in the art without departing from the scope and spirit of the invention set forth in the claims.

What is claimed is:

1. A snapping device comprising:
   a hollow four-sided support having a central hole, the support being secured to a circuit board so that an element mounted on the circuit board is located within the central hole enabling the top of the element to be in contact with a cooler mounted in the support for dissipating heat generated by the element, and;

a fastening resilient strip detachably engageable with the cooler, said strip including a main body, two arms at both ends, and two horizontal positioning members formed by bending the arms;

at least one bolt releasably driven through each of the arms; and a contact section moveable in a direction parallel to the main body so that the contact section is capable of moving along a lengthwise direction of the bolt in response to a rotation of the bolt.

2. The snapping device of claim 1, wherein the contact section comprises a first contact member and a separate second mating contact member capable of engaging with the first contact member; one bolt comprises a first shank; the other bolt comprises a second shank with a tip of the first shank engaged with the first contact member and a tip of the second shank engaged with the second mating contact member respectively, a first slanted surface is formed on the first contact member, and a parallel second slanted surface is formed on the second mating contact member respectively.

3. The snapping device of claim 1, wherein the main body comprises an inverted gable member at its center with the angle of the inverted gable member faced the contact section, and the contact section further comprises a third contact member and a fourth contact member both at the tips of the bolts.

4. The snapping device of claim 1, wherein the main body further comprises a plurality of spaced apart oblique recesses facing the contact section and a plurality of spaced apart oblique blocks are correspondingly provided on the contact section facing the main body, the oblique blocks being capable of being disposed in the oblique recesses.

5. The snapping device of claim 1, wherein each of the positioning members comprises an opening, the support comprises a plurality of threaded holes disposed corresponding to the openings, and the circuit board comprises a plurality of apertures disposed corresponding to the threaded holes, further comprising a plurality of fasteners driven through the support and the circuit board to secure the fastening resilient strip to an abutment plate at a side of the circuit board opposite to the fastening resilient strip.

6. The snapping device of claim 5, wherein the fasteners are either screws or bolt and nut combinations.

7. The snapping device of claim 1, wherein each of the bolts further comprises a slot in its head.

8. The snapping device of claim 7, wherein the slot is a hexagonal slot.

9. The snapping device of claim 1, wherein each of the bolts further comprises a polygonal projection in its head.

10. The snapping device of claim 9, wherein the polygonal projection is a hexagonal projection.

* * * * *